(12) United States Patent
Fujiwara et al.

(10) Patent No.: US 8,412,120 B2
(45) Date of Patent: Apr. 2, 2013

(54) PHASE-LOCKED CIRCUIT AND RADIO COMMUNICATING DEVICE

(75) Inventors: Tetsuya Fujiwara, Kanagawa (JP);
Shingo Harada, Kanagawa (JP)

(73) Assignee: Sony Corporation, Tokyo (JP)

( * ) Notice: Subject to any disclaimer, the term of this patent is extended or adjusted under 35 U.S.C. 154(b) by 115 days.

(21) Appl. No.: 13/067,671

(22) Filed: Jun. 20, 2011

(65) Prior Publication Data

US 2012/0040627 A1     Feb. 16, 2012

(30) Foreign Application Priority Data

Aug. 13, 2010    (JP) ................................. 2010-181247

(51) Int. Cl.
*H04B 1/40*       (2006.01)

(52) U.S. Cl. ....... 455/75; 455/180.3; 455/264; 455/209; 331/36 R; 375/376; 324/72; 324/76.23

(58) Field of Classification Search .................... 455/75, 455/180.3, 260, 262, 264, 265, 209; 331/36 R; 375/373, 376; 324/72, 74, 76.11, 76.23
See application file for complete search history.

(56) References Cited

U.S. PATENT DOCUMENTS

| | | | | |
|---|---|---|---|---|
| 5,361,407 | A * | 11/1994 | Sawada et al. | 455/209 |
| 6,163,585 | A * | 12/2000 | Yamawaki et al. | 375/373 |
| 2010/0026406 | A1 * | 2/2010 | Fujiwara et al. | 331/36 R |

* cited by examiner

*Primary Examiner* — Shaima Q Aminzay
(74) *Attorney, Agent, or Firm* — Rader, Fishman & Grauer PLLC

(57) ABSTRACT

Disclosed herein is a phase-locked circuit including: a phase-locked section including a voltage controlled oscillator having a capacitance bank and changing oscillation frequency according to voltage information, the phase-locked section phase-locking an oscillating signal of the voltage controlled oscillator to a reference signal; and a calibration section having a voltage correcting function for supplying an appropriate calibration voltage to the voltage controlled oscillator in performing frequency calibration for the voltage controlled oscillator; the calibration section including a counter circuit, a first storage circuit and a second storage circuit, a comparator circuit, a control circuit, a voltage generating circuit, and a processing circuit.

8 Claims, 13 Drawing Sheets

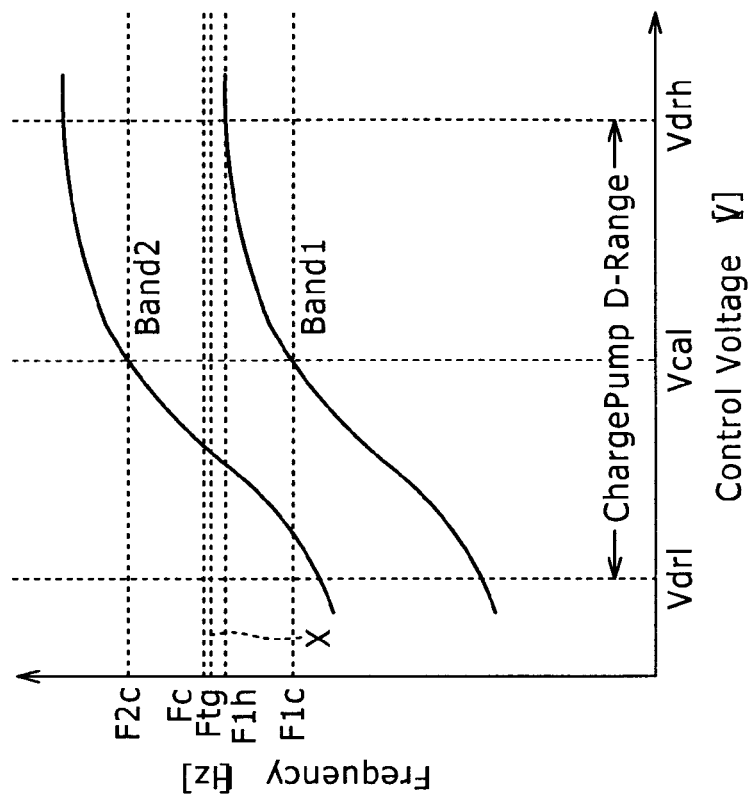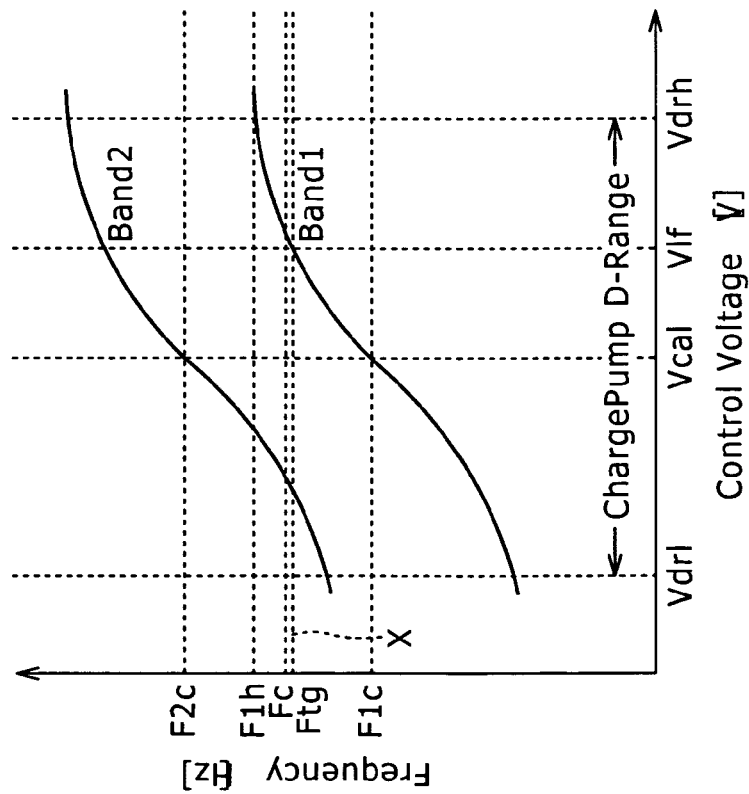

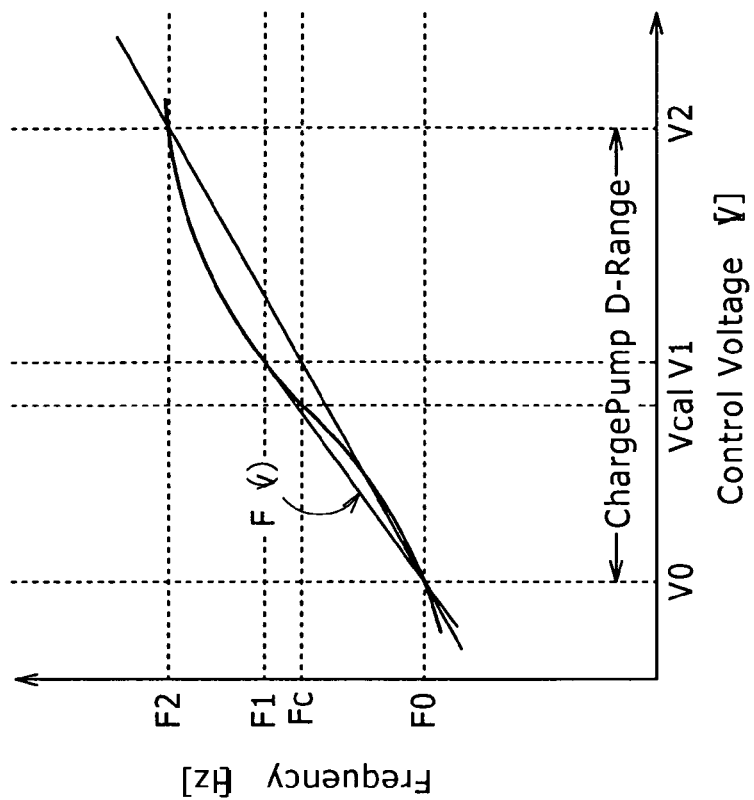
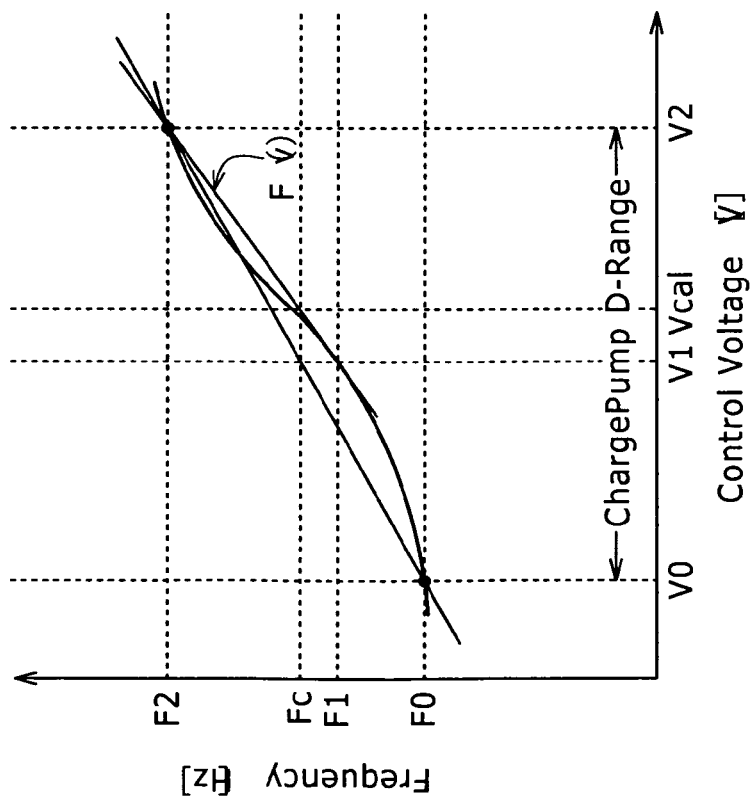

PHASE-LOCKED CIRCUIT AND RADIO COMMUNICATING DEVICE

BACKGROUND

The present disclosure relates to a phase-locked circuit and a radio communicating device that include a calibration circuit having a voltage correcting function for supplying an appropriate calibration voltage to a voltage controlled oscillator.

In an RF transceiver, a frequency synthesizer may now be essential as a local oscillator that can achieve a highly accurate output frequency.

FIG. 1 is a diagram showing a typical configuration of an RF transceiver.

FIG. 2 is a diagram showing a typical configuration of a PLL (frequency synthesizer) in FIG. 1.

The RF transceiver 1 of FIG. 1 has an antenna 2, a low noise amplifier (LNA) 3, a power amplifier (PA) 4, filters 5 and 6, mixers 7 and 8, and a phase-locked circuit (PLL: Phase Locked Loop) 9 as a frequency synthesizer.

The PLL 9 of FIG. 2 has a phase comparator (Phase Frequency Detector: PFD) 10, a charge pump (CP) 11, and a loop filter (LF) 12.

The PLL 9 further includes a voltage controlled oscillator (VCO) 13 and a frequency divider (N) 14.

Because the RF transceiver 1 needs a high-precision modulating and demodulating clock, an LC-VCO using an inductor L and a capacitor C is typically used as the VCO in FIG. 2.

FIG. 3 is a diagram showing a typical configuration of the LC-VCO.

As shown in FIG. 3, the LC-VCO includes an inductor L, an offset capacitance COS, a varactor capacitance CVAR, a transistor TR for realizing a negative resistance, and circuit bias resistances RTOP and RBTM.

In this case, a terminal TVCTL and a terminal TOUT in FIG. 3 respectively represent a terminal TVCTL and a terminal TOUT in FIG. 2.

An operation of the PLL using the LC-VCO as the VCO 13 will be briefly described in the following.

First, the PFD 10 detects a phase difference between a reference signal REF and a signal FB obtained by frequency-dividing the output OUT of the PLL 9 as phase difference information, and passes the phase difference to the CP 11.

The CP 11 sends a current corresponding to the phase difference into the LF 12. The LF 12 converts the current into voltage information. The VCO 13 receives the voltage VCTL. The VCO 13 changes the capacitance of the varactor capacitance CVAR, and thereby changes oscillation frequency.

The feedback is thus performed until the phases (frequencies) of the reference signal REF and the signal FB become identical with each other. A clock synchronized with the reference signal REF is thereby generated.

FIG. 4 is a diagram showing the control voltage versus frequency characteristic of the LC-VCO.

In general, the variable range of oscillation frequency of the LC-VCO is about twofold at most in terms of practical performance. The frequency is changed as indicated by a reference A in FIG. 4.

This is realized by providing the varactor capacitance CVAR and the offset capacitance COS for a few bits, changing the capacitances stepwise (digitally), and changing the capacitances between steps continuously (in an analog manner) by the varactor capacitance CVAR.

Although a characteristic as indicated by a reference B in FIG. 4, for example, is also conceivable, it is difficult to realize the characteristic by an LC-VCO. Even if the characteristic can be realized, the voltage versus frequency conversion gain Kvco of the VCO 13 is increased.

When the voltage versus frequency conversion gain Kvco is increased, the current noise of the CP 11, the resistance noise of the LF 12, and the like are multiplied by the voltage versus frequency conversion gain Kvco, and are converted into the output phase noise of the VCO 13.

Thus, a low voltage versus frequency conversion gain Kvco is generally desirable, and phase noise design for the whole of the PLL can be relaxed by decreasing the voltage versus frequency conversion gain Kvco as much as possible.

That is, the oscillation frequency is generally changed as shown by characteristic curves A in FIG. 4. Even so, a wide frequency range can be covered by a low voltage versus frequency conversion gain Kvco.

One covered frequency range switched digitally will be referred to as a "band."

It is very important in this case to provide frequency redundancy between bands. This frequency redundancy will be referred to as a "band overlap."

This band overlap will be defined also for later description.

FIG. 5 is a diagram of assistance in explaining the definition of the band overlap.

Directing attention to a band Band1 shown in FIG. 5, because a band overlap is a frequency redundancy between two bands, there are a band overlap BOLH between the band Band1 and a band Band2 and a band overlap BOLL between the band Band1 and a band Band0.

The band overlap BOLH is defined as a margin possessed with respect to an intermediate frequency F12c between the respective frequencies F1 and F2 of the bands Band1 and Band2 at a frequency calibration voltage Vcal.

Specifically, the band overlap BOLH is a margin possessed by an oscillation frequency F1h when a maximum control voltage Vdrh is given to the band Band1 with respect to the intermediate frequency F12c. The band overlap BOLH is expressed as follows.

$$BOHL = \frac{(F1h - F12c)}{F1c} \times 100 \ [\%] \quad \text{[Equation 1]}$$

In this case, the intermediate frequency F12c is obtained by the following equation.

$$F12c = \frac{F2c + F1c}{2} \quad \text{[Equation 2]}$$

Similarly, the band overlap BOLL is defined as a margin possessed with respect to an intermediate frequency F01c between the respective frequencies F0 and F1 of the bands Band0 and Band1 at the frequency calibration voltage Vcal.

Specifically, the band overlap BOLL is a margin possessed by an oscillation frequency F1min when a minimum control voltage Vdrl is given to the band Band0 with respect to the intermediate frequency F01c. The band overlap BOLL is expressed as follows.

$$BOLL = \frac{(F01c - F11)}{F1c} \times 100 \ [\%] \quad \text{[Equation 3]}$$

The intermediate frequency F01c is obtained by the following equation.

$$F01c = \frac{F1c + F0c}{2}$$ [Equation 4]

Without the band overlap, the PLL cannot be frequency-locked when a target frequency falls exactly in a frequency gap between the bands.

However, obtaining a large band overlap is equivalent to raising the voltage versus frequency conversion gain Kvco, and there is a tradeoff between the obtainment of a large band overlap and PLL phase noise design. Thus, there is generally a desire to design as small a band overlap as possible.

The voltages Vdrh and Vdrl in the above description are respectively the maximum value and the minimum value of an output dynamic range where the CP can ensure performance.

Thus, a variable frequency range is limited by the voltages. Therefore, when similar frequency change is realized by the same number of bits in an advanced low-voltage process, the voltage versus frequency conversion gain Kvco is raised, and design becomes stringent.

Further, there may be a desire to achieve locking to a target frequency as a system requirement specification, and perform fine tuning by varying the frequency by plus or minus a few percent. The band overlap is an important index also in such a case.

Because a covered frequency range is limited by a band as in the above description, an appropriate band needs to be selected so that the PLL is locked to a target frequency, and frequency calibration needs to be performed.

Thus, as shown in FIG. 6, a circuit for performing the frequency calibration is necessary in addition to the PLL proper.

FIG. 6 is a diagram showing the PLL proper and the calibration circuit.

The calibration circuit 20 has a frequency counter (FC) 21, a target frequency storage circuit (REGTG) 22, and a counter value retaining circuit (REGFC) 23 for retaining a counter value of the frequency counter.

The calibration circuit 20 has a comparator circuit (COMP) 24 for comparing a target frequency with a value counted by the FC 21.

The calibration circuit 20 has a control circuit (CTL) 25 for determining a result of the comparison of the COMP 24 and supplying a control signal to the VCO 13 and a bias circuit (VBIAS) 26 for supplying a voltage to a control voltage terminal of the VCO 13.

FIG. 7 is a diagram showing a typical calibration sequence.

A typical calibration sequence will next be described with reference to FIG. 7.

First, the CTL 25 shown in FIG. 6 outputs a control signal SCTL so that the VCO 13 oscillates at a lowest frequency, and the VBIAS 26 supplies a control voltage value (ST1).

In this case, N denotes an SCTL code, and a state is assumed in which all the capacitances are set in an ON state and the oscillation frequency becomes lowest by maximizing N. In this state, an external reference clock REFCLK is set to a specified count time, and the FC 21 counts the oscillation frequency of the VCO 13 (ST2).

The COMP 24 compares a result of the count of the FC 21 with a target frequency retained in the REGTG 22. When the result of the count of the FC 21 is lower than the target frequency, the result is retained in the REGFC 23. The CTL 25 changes the control signal SCTL again, and controls the control signal SCTL so as to increase the oscillation frequency of the VCO 13. The above sequence is repeated until the oscillation frequency exceeds the target frequency.

When the oscillation frequency exceeds the target frequency, a comparison is made to determine which of the present count value and a count value in an immediately preceding state which count value is retained in the REGFC 23 is closer to the target value, and a band to be used is determined. The calibration sequence is then ended.

It is very important in this frequency calibration not to select a wrong band.

A wrong band selection is made due to relation between the voltage supplied at the time of the calibration which voltage is represented by VCTL in FIG. 6 and the oscillation frequency of the VCO.

FIGS. 8A and 8B show an example of this phenomenon.

FIGS. 8A and 8B are diagrams showing a control voltage versus frequency characteristic of the VCO, the diagrams being of assistance in explaining an error in frequency calibration by calibration voltage.

FIG. 8A shows an example of a calibration success.

In this example, there is a calibration voltage Vcal exactly midway between the upper limit Vdrh and the lower limit Vdrl of the control voltage of the VCO 13, and each band is symmetric with respect to an intersection with the calibration voltage Vcal between the limits Vdrl and Vdrh.

Suppose that there is a target frequency Ftg as indicated by a line X for two bands Band1 and Band2. In addition, frequencies when the calibration voltage Vcal is given to the bands Band1 and Band2 are denoted as F1c and F2c, respectively, and an intermediate frequency of the frequencies F1c and F2c is Fc.

From the above description of the calibration sequence, because Ftg<Fc, the calibration circuit selects the band Band1.

Thus, the calibration sequence is ended. When the PLL is operated, the control voltage for the PLL changes, and the PLL is locked to the target frequency Ftg with Vctl=Vlf. At this time, it is shown that a frequency F1h is sufficiently higher than the target frequency Ftg, and that there is a margin.

On the other hand, FIG. 8B shows an example of a calibration error.

In this example, the relation between the voltages Vdrl, Vcal, and Vdrh is the same, whereas each band is asymmetric with respect to the calibration voltage Vcal between the limits Vdrl and Vdrh.

From FIG. 8B, Ftg<Fc. Thus, the frequency calibration circuit 20 selects the band Band1. Even when the calibration sequence is ended to proceed to PLL operation, the control voltage is changed, and the maximum frequency F1h of the band Band1 is reached, the target frequency Ftg is not reached.

That is, in the case where frequency calibration is performed by the calibration voltage Vcal shown in FIG. 8B, the PLL cannot be locked to the target frequency Ftg, and the wrong band is selected.

SUMMARY

As described above, the control voltage versus frequency characteristic of the VCO 13 is nonlinear and asymmetric. This nonlinearity and this asymmetry change depending on a manufacturing process, temperature, and the like.

Thus, when a fixed voltage as in the above description is used for frequency calibration, a band not reaching a target frequency may be selected.

In order to prevent this calibration error, design is made so as to increase the band overlap by increasing the varactor capacitance and thereby increasing an amount of frequency variation, and be thus able to cover a target frequency surely.

However, as described earlier, obtaining a large band overlap is equivalent to increasing the voltage versus frequency conversion gain Kvco, and a tradeoff between the obtainment of a large band overlap and PLL phase noise design becomes a problem.

It is desirable to provide a phase-locked circuit and a radio communicating device that can generate a voltage at a time of appropriate frequency correction, eliminate a frequency correction error, hold the voltage versus frequency conversion gain Kvco low, and relax PLL phase noise design.

According to a first viewpoint of the present disclosure, there is provided a phase-locked circuit including: a phase-locked section including a voltage controlled oscillator having a capacitance bank and changing oscillation frequency according to voltage information, the phase-locked section phase-locking an oscillating signal of the voltage controlled oscillator to a reference signal; and a calibration section having a voltage correcting function for supplying an appropriate calibration voltage to the voltage controlled oscillator in performing frequency calibration for the voltage controlled oscillator. The calibration section includes a counter circuit for counting frequency of the output oscillating signal of the voltage controlled oscillator, a first storage circuit and a second storage circuit for retaining a count result of the counter circuit, a comparator circuit for comparing the count result of the counter circuit with a target frequency, and determining whether the count result of the counter circuit is higher than the target frequency, a control circuit for receiving a result of the comparator circuit, comparing the count result of the counter circuit with a result retained by the first storage circuit, and controlling the capacitance bank of the voltage controlled oscillator, a voltage generating circuit for generating the calibration voltage, and supplying the calibration voltage to the voltage controlled oscillator, and a processing circuit for performing calculation from the count result of the counter circuit and results of the first storage circuit and the second storage circuit, and controlling the voltage generating circuit according to a result of the calculation.

According to a second viewpoint of the present disclosure; there is provided a radio communicating device including: an antenna receiving a radio signal; a phase-locked circuit for outputting an oscillating signal phase-locked to a reference signal; a low noise amplifier for controlling a gain of the received signal received by the antenna; a first frequency converting section for subjecting the received signal received via the low noise amplifier to frequency conversion receiving the oscillating signal of the phase-locked circuit; a second frequency converting section for subjecting a transmission signal to frequency conversion receiving the oscillating signal of the phase-locked circuit; and a power amplifier for amplifying the transmission signal resulting from the frequency conversion of the second frequency converting section, and outputting the transmission signal to a side of the antenna. The phase-locked circuit includes a phase-locked section including a voltage controlled oscillator having a capacitance bank and changing oscillation frequency according to voltage information, the phase-locked section phase-locking the oscillating signal of the voltage controlled oscillator to the reference signal, and a calibration section having a voltage correcting function for supplying an appropriate calibration voltage to the voltage controlled oscillator in performing frequency calibration for the voltage controlled oscillator, the calibration section including a counter circuit for counting frequency of the output oscillating signal of the voltage controlled oscillator, a first storage circuit and a second storage circuit for retaining a count result of the counter circuit, a comparator circuit for comparing the count result of the counter circuit with a target frequency, and determining whether the count result of the counter circuit is higher than the target frequency, a control circuit for receiving a result of the comparator circuit, comparing the count result of the counter circuit with a result retained by the first storage circuit, and controlling the capacitance bank of the voltage controlled oscillator, a voltage generating circuit for generating the calibration voltage, and supplying the calibration voltage to the voltage controlled oscillator, and a processing circuit for performing calculation from the count result of the counter circuit and results of the first storage circuit and the second storage circuit, and controlling the voltage generating circuit according to a result of the calculation.

According to the present disclosure, it is possible to generate a voltage at a time of appropriate frequency correction, eliminate a frequency correction error, hold the voltage versus frequency conversion gain Kvco low, and relax PLL phase noise design.

BRIEF DESCRIPTION OF THE DRAWINGS

FIGS. 8A and 8B are diagrams showing a control voltage versus frequency characteristic of a VCO, the diagrams being of assistance in explaining an error in frequency calibration by calibration voltage;

FIGS. 13A and 13B are diagrams showing a control voltage versus frequency characteristic, the diagrams being of assistance in explaining frequency calibration according to the present embodiment.

DETAILED DESCRIPTION OF THE PREFERRED EMBODIMENTS

Preferred embodiments of the present disclosure will hereinafter be described with reference to the drawings.

Incidentally, description will be made in the following order.
1. Basic Configuration of RF transceiver (Radio Communicating Device) and PLL
2. Configuration and Calibration Sequence of Frequency Calibration Circuit <1. Basic Configuration of RF transceiver (Radio Communicating Device) and PLL>

Figure 9:
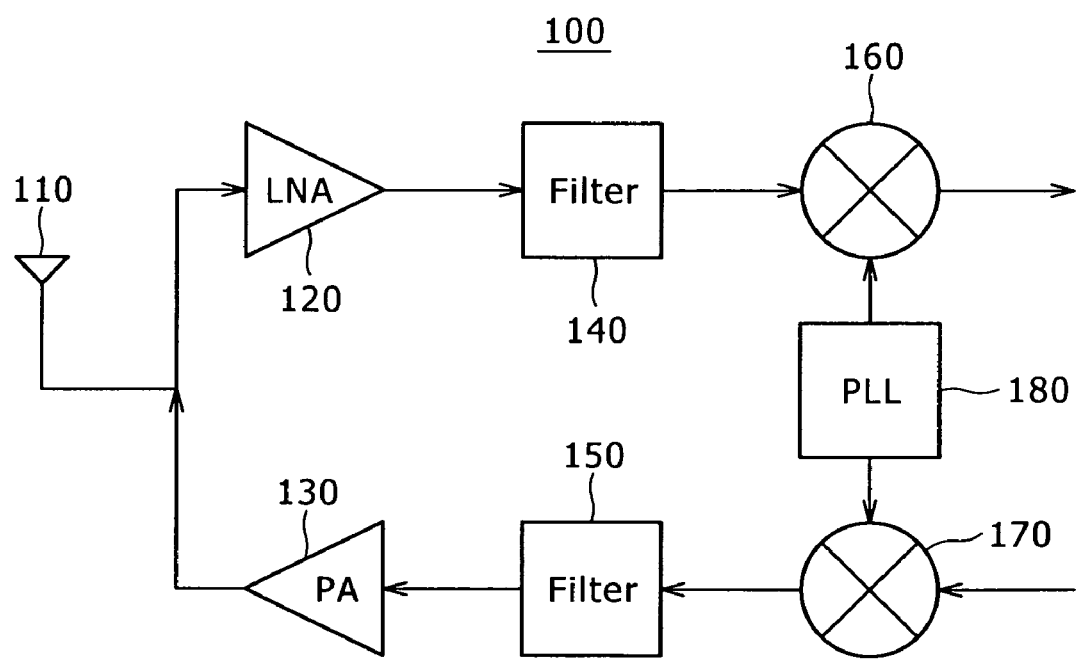
FIG. 9 is a diagram showing an example of configuration of an RF transceiver as a radio communicating device according to an embodiment of the present disclosure.

FIG. 9 is a diagram showing an example of configuration of an RF transceiver as a radio communicating device according to an embodiment of the present disclosure.

Figure 10:
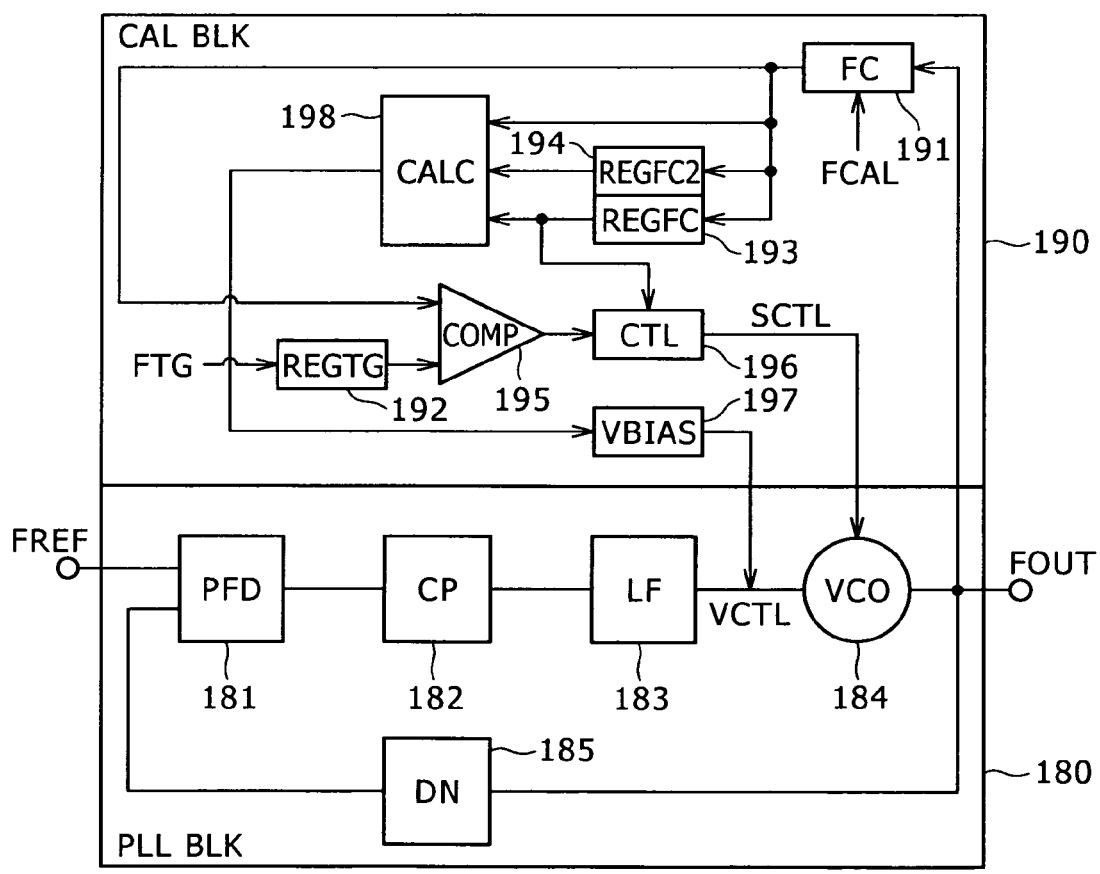
FIG. 10 is a diagram showing an example of configuration of a PLL (frequency synthesizer) including a calibration circuit according to an embodiment of the present disclosure.

FIG. 10 is a diagram showing an example of configuration of a PLL (frequency synthesizer) including a calibration circuit according to an embodiment of the present disclosure.

The RF transceiver 100 of FIG. 9 has an antenna 110, an LNA (Low Noise Amplifier) 120, a PA (Power Amplifier) 130, and filters 140 and 150.

The RF transceiver 100 has a mixer 160 as a first frequency converting section, a mixer 170 as a second frequency converting section, and a PLL (Phase Locked Loop) 180 as a frequency synthesizer. The PLL forms a phase locked section.

In the RF transceiver 100, a received signal received by the antenna 110 is controlled in gain by the LNA 120, and supplied to the mixer 160 via the filter 140.

The mixer 160 derives a frequency difference on the basis of a local oscillation signal from the PLL 180, and outputs the frequency difference to a processing system in a subsequent stage.

In addition, a transmission signal is subjected to a mixing process in the mixer 170 receiving the local oscillation signal supplied from the PLL 180, amplified by the PA 130 via the filter 150, and then transmitted by radio via the antenna 110.

As shown in FIG. 10, the PLL 180 includes a frequency calibration circuit 190.

The PLL 180 in FIG. 10 has a PFD (Phase Frequency Detector: Phase Comparator) 181, a CP (Charge Pump) 182, and an LF (Loop Filter) 183.

The PLL 180 further includes a VCO (Voltage Controlled Oscillator) 184 and a DN (Divider: Frequency Divider) 185.

Because the RF transceiver 100 needs a high-precision modulating and demodulating clock, an LC-VCO using an inductor L and a capacitor C is used as the VCO 184 in FIG. 10.

Figure 11:
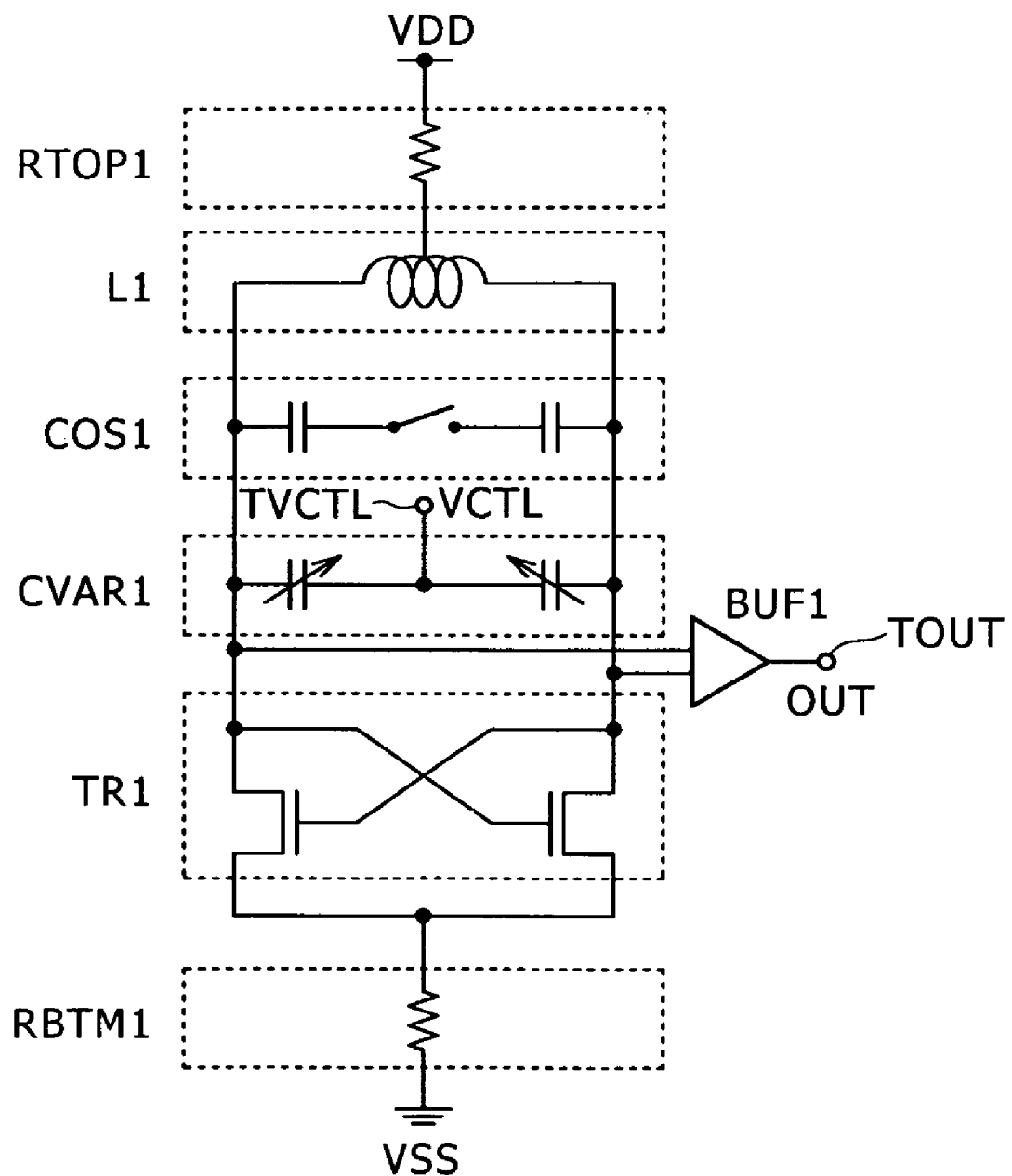
FIG. 11 is a diagram showing an example of configuration of an LC-VCO.

FIG. 11 is a diagram showing an example of configuration of the LC-VCO.

As shown in FIG. 11, the LC-VCO includes an inductor L1, an offset capacitance COS1, a varactor capacitance CVAR1, a transistor TR1 for realizing a negative resistance, and circuit bias resistances RTOP1 and RBTM1.

In this case, a terminal TVCTL and a terminal TOUT in FIG. 11 respectively represent a terminal TVCTL and a terminal TOUT in FIG. 10.

An operation of the PLL using the LC-VCO as the VCO 184 will be briefly described in the following.

First, the PFD 181 detects a phase difference between a reference signal REF and a signal FB obtained by frequency-dividing the output OUT of the PLL 180 as phase difference information, and passes the phase difference to the CP 182.

The CP 182 sends a current corresponding to the phase difference into the LF 183. The LF 183 converts the current into voltage information. The VCO 184 receives the voltage VCTL. The VCO 184 changes the capacitance of the varactor capacitance CVAR1, and thereby changes oscillation frequency.

The feedback is thus performed until the phases (frequencies) of the reference signal REF and the signal FB become identical with each other. A clock synchronized with the reference signal REF is thereby generated.

The calibration circuit 190 according to the present embodiment supplies a calibration voltage to the VCO 184 at an appropriate time of frequency calibration even when a manufacturing process corner varies.

Thereby, a band overlap can be secured, and a tradeoff for constant design for the PLL can be relaxed by not increasing a voltage versus frequency conversion gain Kvco more than is necessary.

A configuration and a calibration sequence of the frequency calibration circuit will be described in the following.

<2. Configuration and Calibration Sequence of Frequency Calibration Circuit>

The calibration circuit 190 has a frequency counter (FC) 191, a target frequency storage circuit (REGTG) 192, and counter value retaining circuits (REGFC and REGFC2) 193 and 194 for retaining a counter value of the frequency counter (FC) 191.

The calibration circuit 190 has a comparator circuit (COMP) 195 for comparing a target frequency with a value counted by the FC 191.

The calibration circuit 190 has a control circuit (CTL) 196 for determining a result of the comparison of the COMP 195 and supplying a control signal to the VCO 184 and a bias circuit (VBIAS) 197 for supplying a calibration voltage to a control voltage terminal of the VCO 184. The VBIAS 197 forms a voltage generating circuit.

The calibration circuit 190 has a processing circuit (CALC) 198 for performing operation from a count result of the FC 191 and results of the two retaining circuits 193 and 194 according to the values retained by the counter value retaining circuits (REGFC and REGFC2) 193 and 194, and controlling the VBIAS 197.

Figure 12:
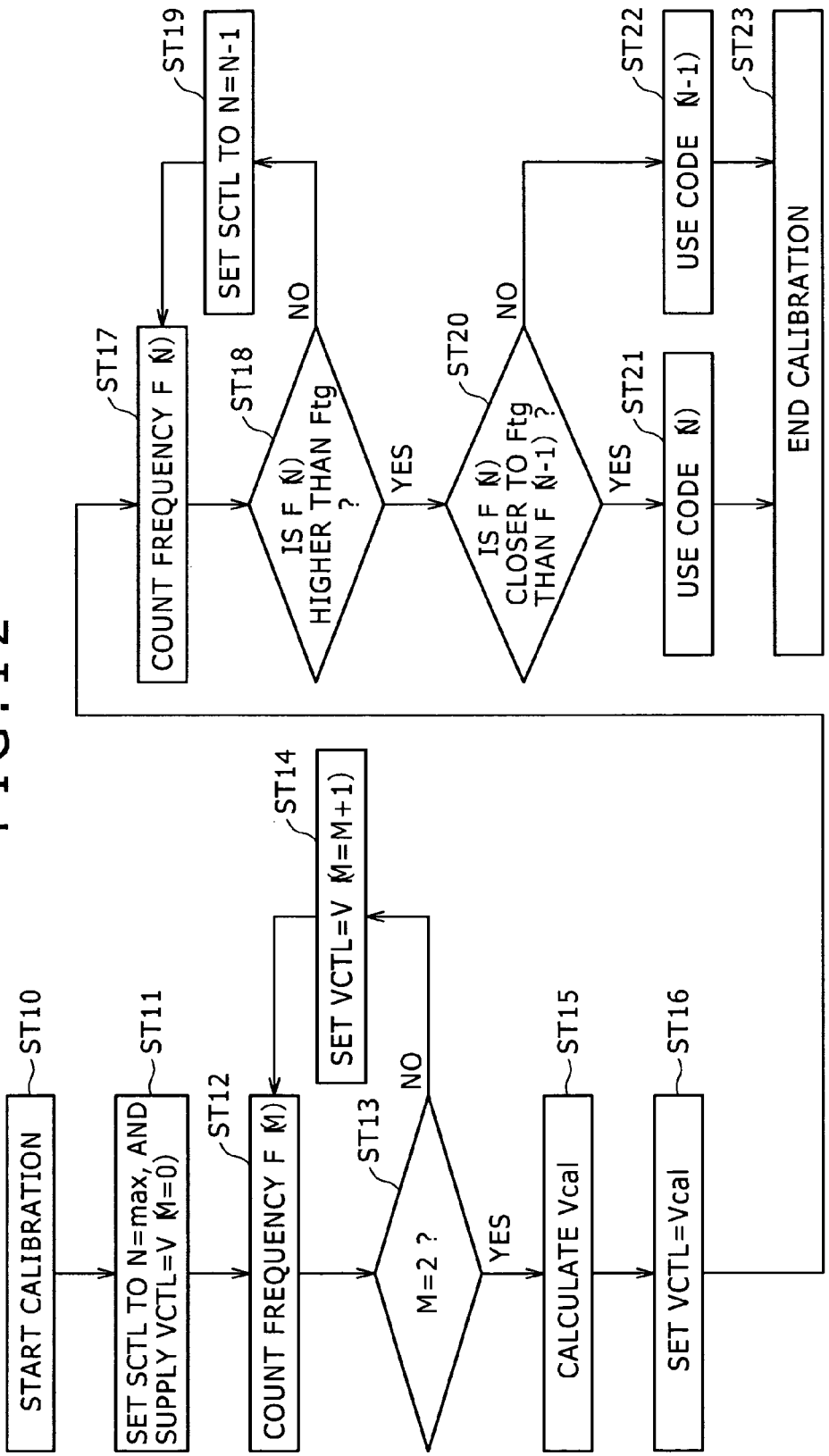
FIG. 12 is a chart showing a calibration sequence according to the present embodiment.

FIG. 12 is a chart showing the calibration sequence according to the present embodiment.

FIGS. 13A and 13B are diagrams showing a control voltage versus frequency characteristic, the diagrams being of assistance in explaining frequency calibration according to the present embodiment.

FIG. 13A represents a case where (Intermediate Frequency Fc)>(Frequency F1 of Band1). FIG. 13B represents a case where Fc<F1.

The calibration sequence according to the present embodiment will next be described with reference to FIG. 12 and FIGS. 13A and 13B.

When calibration is started, the CTL 196 first turns on all capacitances of the capacitance bank with the code of a control signal SCTL at a maximum (N=max) to set the VCO 184 in a state of operating most slowly (ST11).

In addition, the VBIAS 197 generates three kinds of voltage V(M), where M=0, 1, 2, as a voltage VCTL. The VBIAS 197 first sets the voltage VCTL to a first voltage V(0) (corresponding to V0 shown in FIGS. 13A and 13B), and supplies the first voltage V(0) to the VCO 184.

The FC 191 counts a first frequency F0 at this time, and stores the value of the count in the REGFC 193.

Next, the VBIAS 197 sets the voltage VCTL to a second voltage V(1) (corresponding to V1 shown in FIGS. 13A and 13B), and supplies the second voltage V(1) to the VCO 184. As in the above, the FC 191 counts a second frequency F1, and stores a result of the count in the REGFC (2) 194.

Next, the VBIAS 197 sets the voltage VCTL to a third voltage V(2) (corresponding to V2 shown in FIGS. 13A and 13B), and supplies the third voltage V(2) to the VCO 184. As in the above, the FC 191 counts a third frequency F2 (ST12 to ST14).

While the second voltage V1 can be arbitrarily selected between the first voltage V0 and the third voltage V2 in each individual case, it is desirable to use an intermediate voltage of a power supply ground from a viewpoint of ease of generation of the second voltage V1, for example. Thus, description will be made in the following supposing that the second voltage V1 is selected to be an intermediate voltage between the first voltage V0 and the third voltage V2.

Next, three pieces of frequency data obtained by the above measurement are supplied to the CALC (the processing circuit or an arithmetic unit) 198, where operation is performed as follows (ST15).

An intermediate frequency Fc is obtained by the following Equation 5 from the first frequency F0 and the third frequency F2.

$$Fc = \frac{F2 + F0}{2} \quad \text{[Equation 5]}$$

Next, whether the second frequency F1 is higher than the intermediate frequency Fc or lower than the intermediate frequency Fc is determined, case separation is made, an approximate linear function F(v) in each of the cases as shown in FIGS. 13A and 13B is obtained, and an approximate calibration voltage Vcal when the approximate linear function F(v) yields the intermediate frequency Fc is obtained.

When Fc>F1, the function F(v) is obtained as in the following Equation 6.

$$F(v) = \frac{F2 - F1}{V2 - V1}(v - V1) + F1 \quad \text{[Equation 6]}$$

The voltage Vcal can be calculated as in the following Equation 7.

$$Vcal = \frac{Fc - F1}{F2 - F1}(V2 - V1) + V1 \quad \text{[Equation 7]}$$

Similarly, when Fc<F1, the voltage Vcal is as in the following Equation 8.

$$Vcal = \frac{Fc - F0}{F1 - F0}(V1 - V0) + V0 \quad \text{[Equation 8]}$$

The CALC 198 controls the VBIAS 197 on the basis of a result of this operation. The VBIAS 197 outputs a voltage corresponding to the result (ST16).

Figure 1:
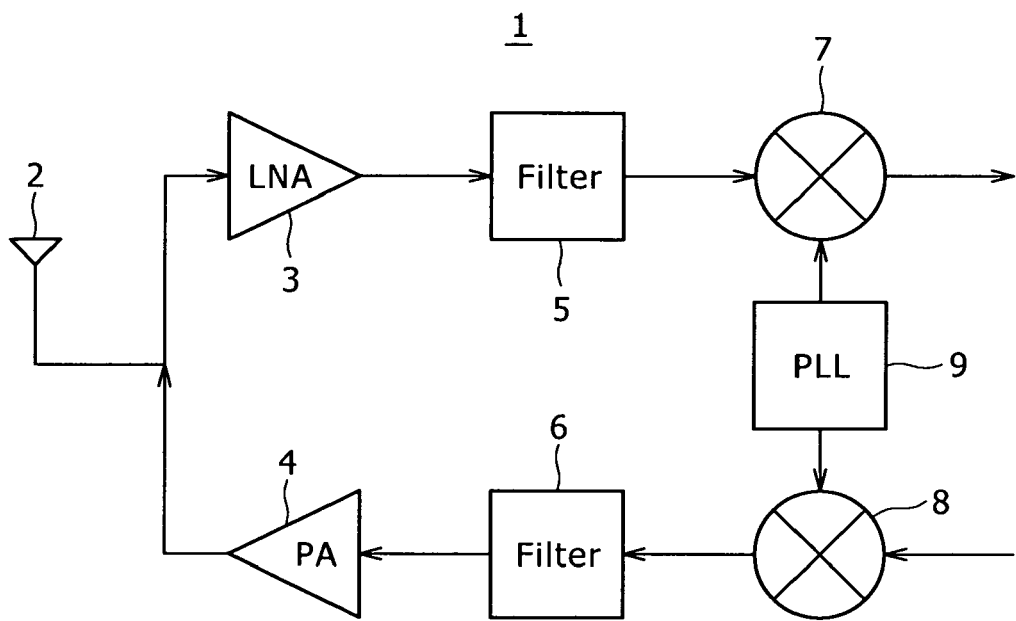
FIG. 1 is a diagram showing a typical configuration of an RF transceiver.
Figure 2:
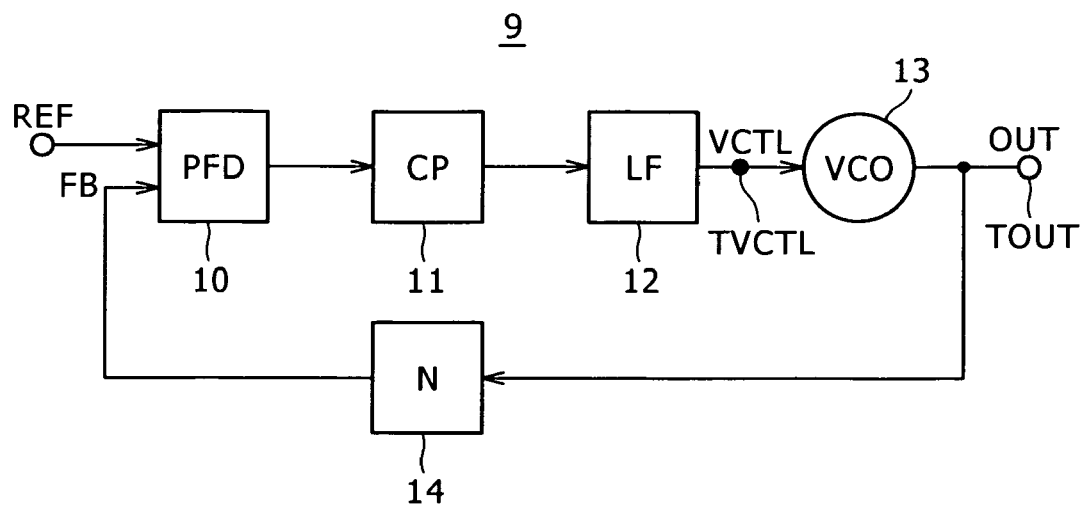
FIG. 2 is a diagram showing a typical configuration of a PLL (frequency synthesizer) in FIG. 1.
Figure 3:
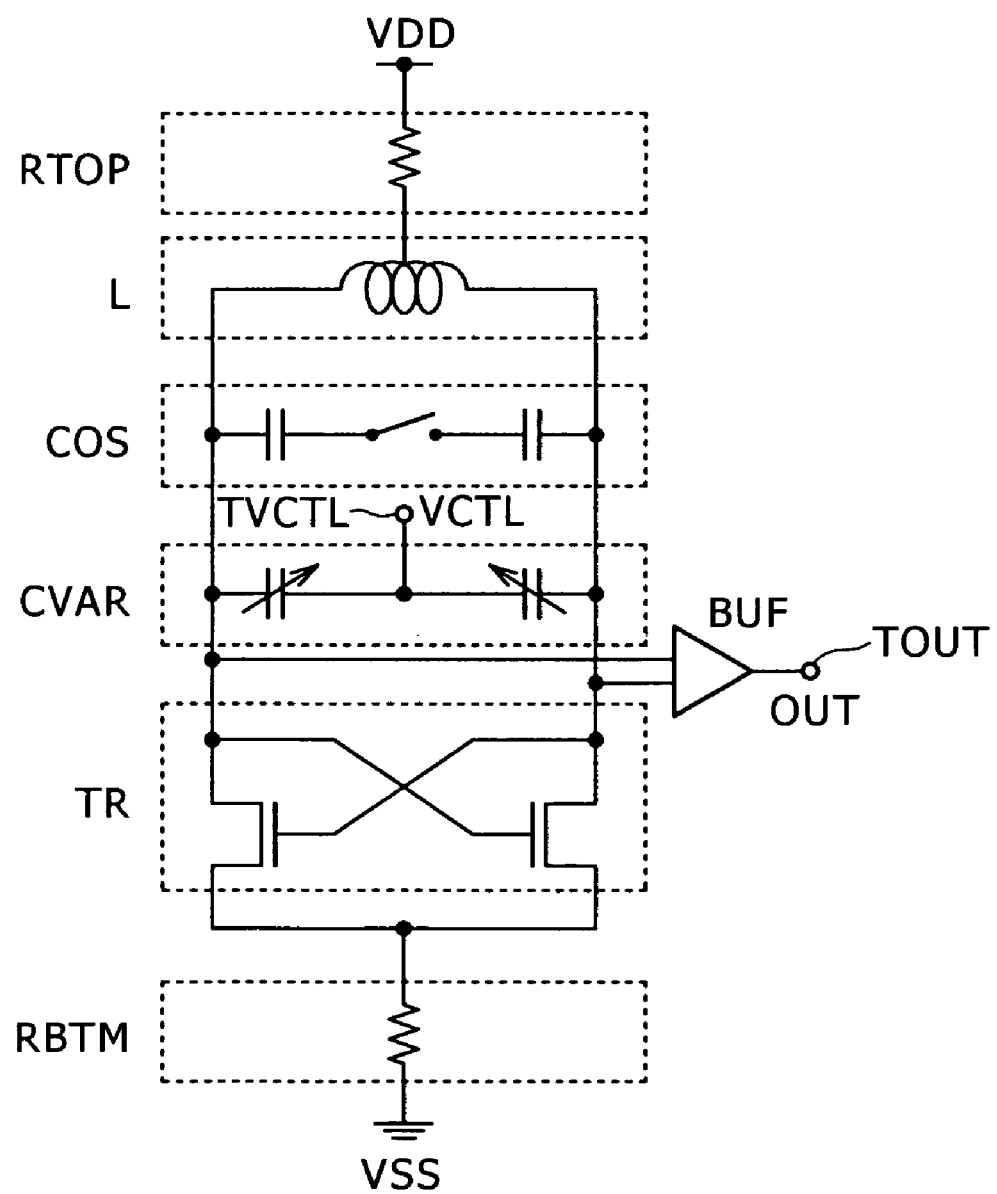
FIG. 3 is a diagram showing a typical configuration of an LC-VCO.
Figure 4:
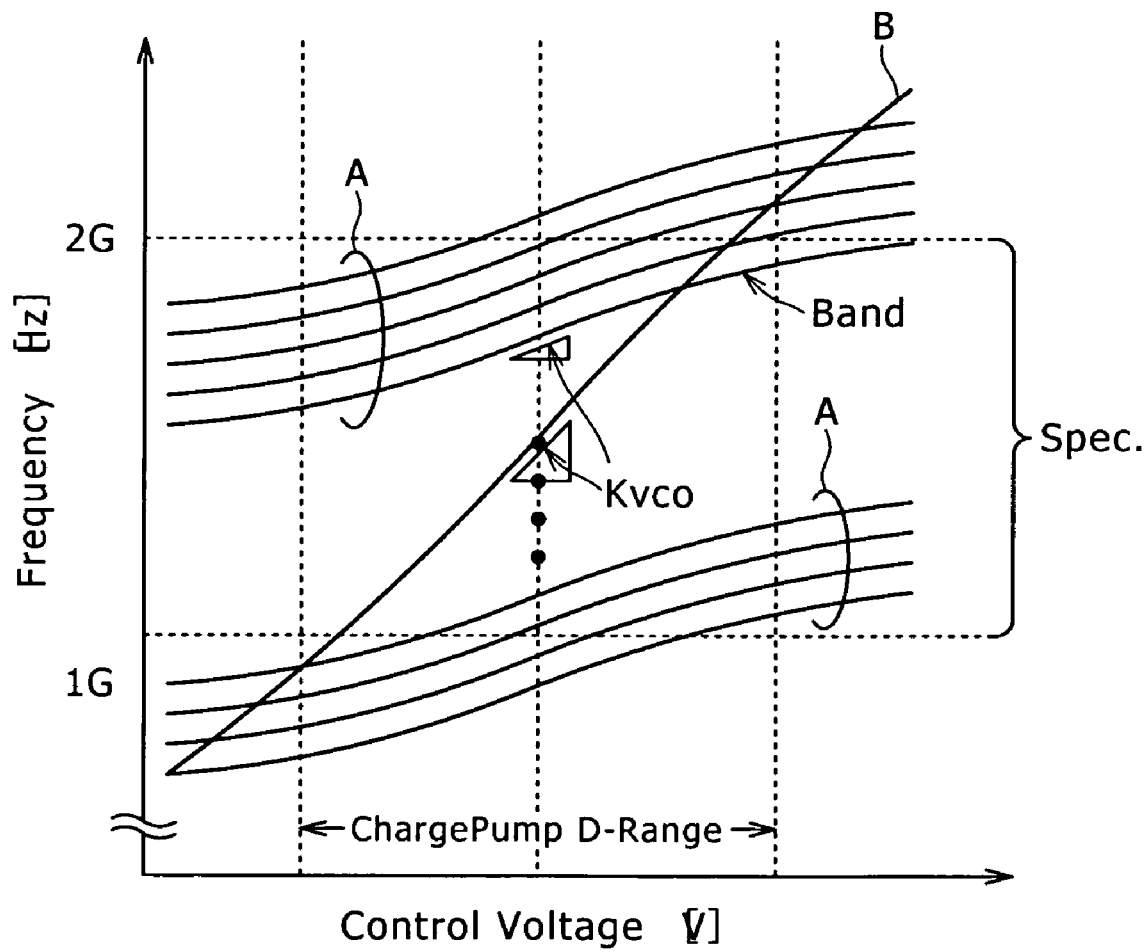
FIG. 4 is a diagram showing the control voltage versus frequency characteristic of the LC-VCO.
Figure 5:
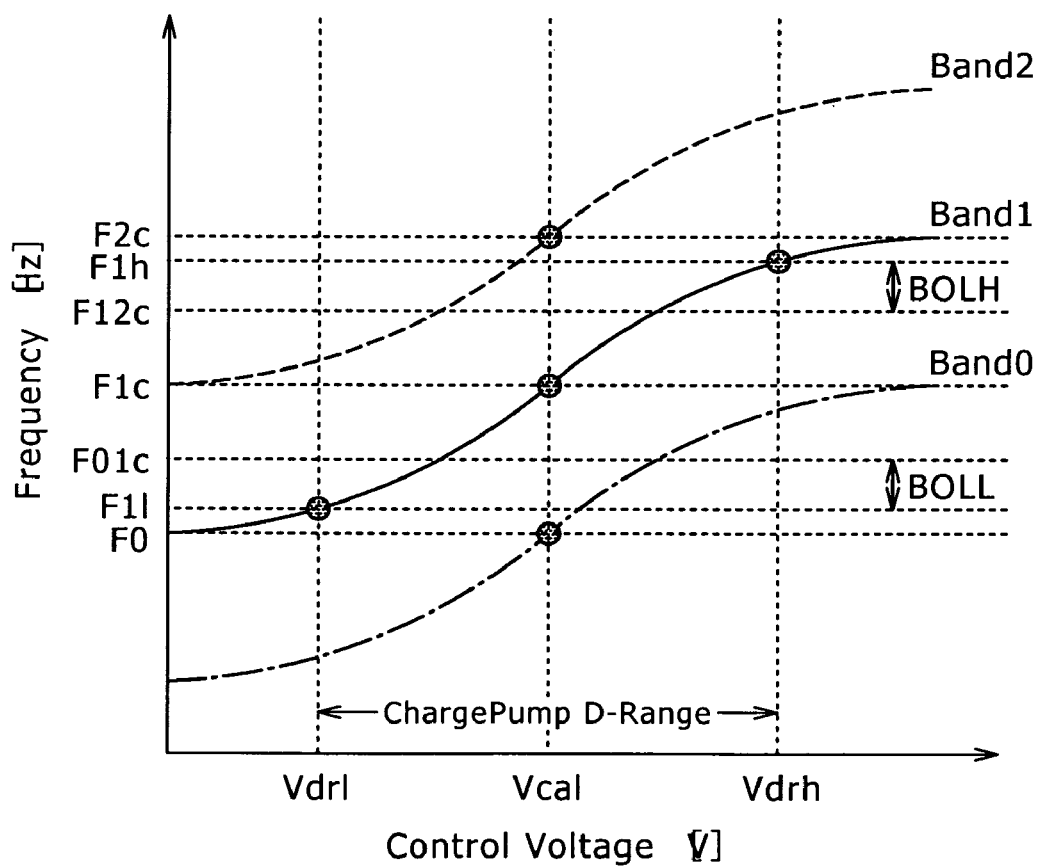
FIG. 5 is a diagram of assistance in explaining the definition of a band overlap.
Figure 6:
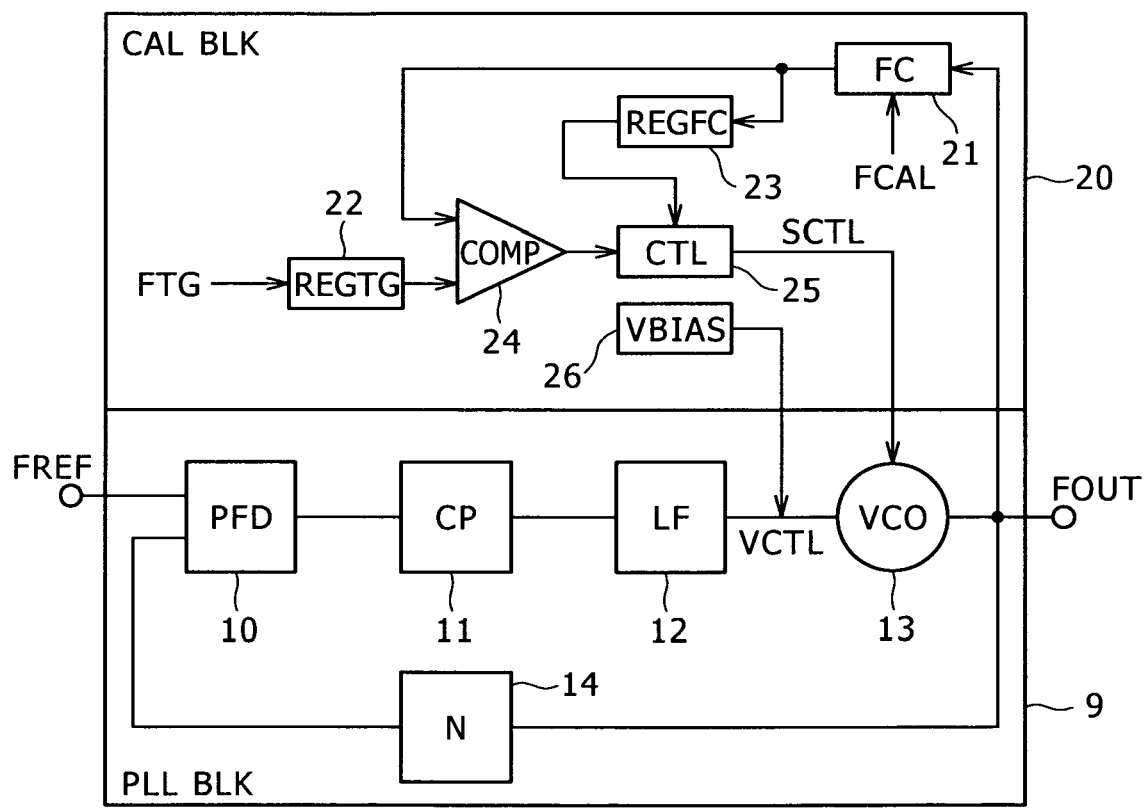
FIG. 6 is a diagram showing a PLL proper and a calibration circuit.
Figure 7:
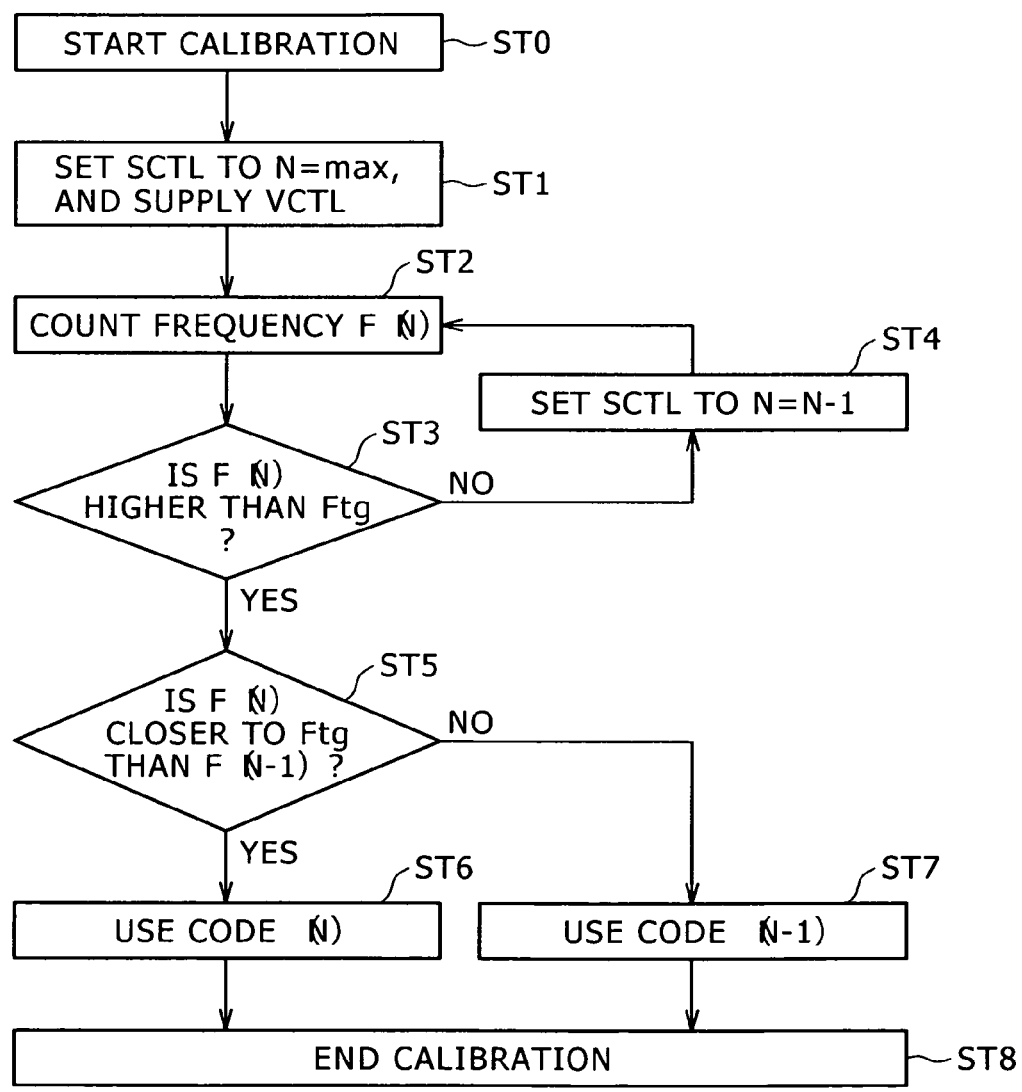
FIG. 7 is a diagram showing a typical calibration sequence.

A process of steps ST17 to ST23 is subsequently performed (the process of steps ST17 to ST23 is basically similar to the process in FIG. 7).

An external reference clock REFCLK is set to a specified count time, and the FC 191 counts the oscillation frequency of the VCO 184 (ST17 to ST19).

The COMP 195 compares a result of the count of the FC 191 with a target frequency retained in the REGTG 192. When the result of the count of the FC 191 is lower than the target frequency, the result is retained in the REGFC 193. The CTL 195 changes the control signal SCTL again, and controls the control signal SCTL so as to increase the oscillation frequency of the VCO 184. The above sequence is repeated until the oscillation frequency exceeds the target frequency.

When the oscillation frequency exceeds the target frequency, a comparison is made to determine which of the present count value and a count value in an immediately preceding state which count value is retained in the REGFC 193 is closer to the target value, and a band to be used is determined. The calibration sequence is then ended.

Figure 14:
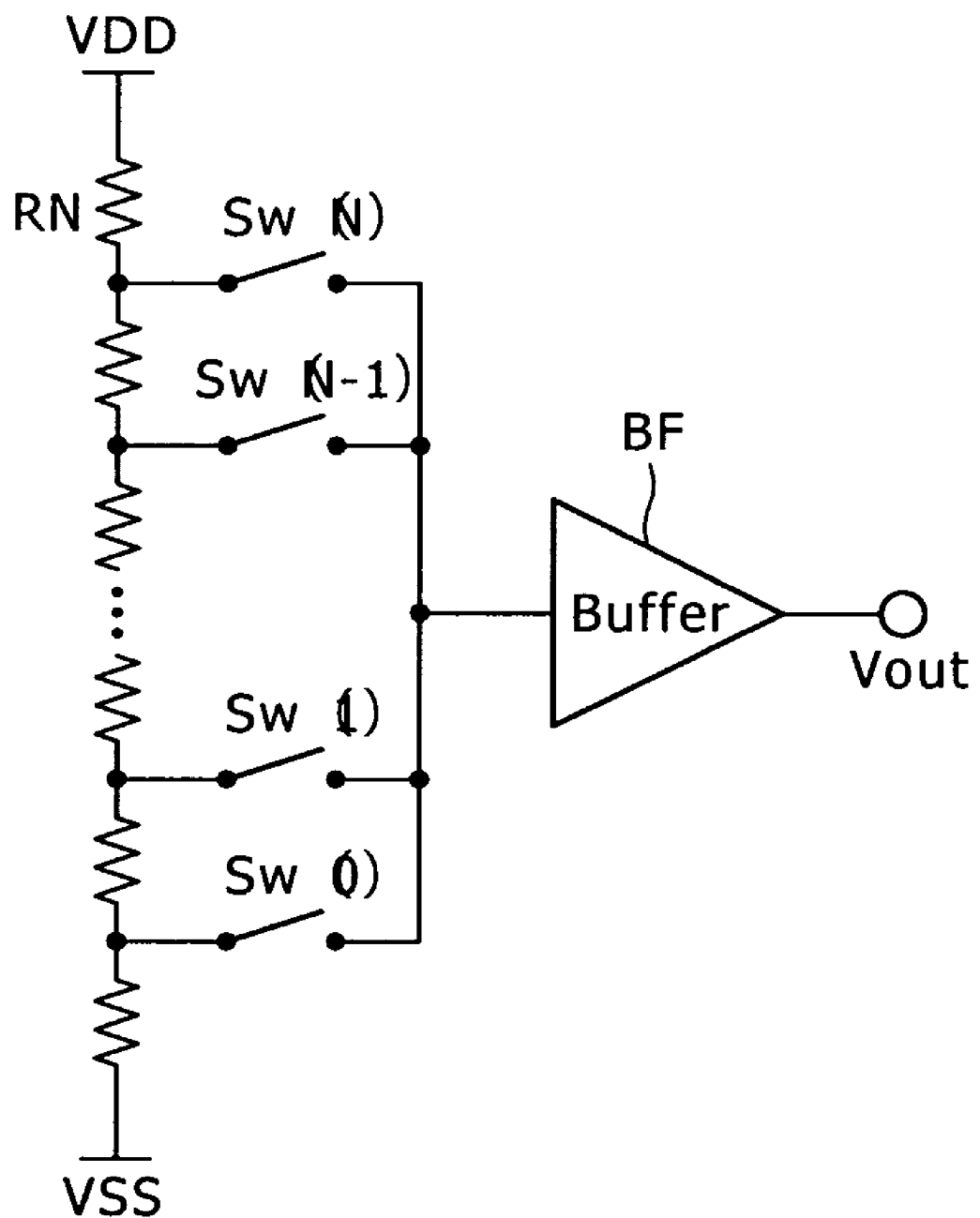
FIG. 14 is a diagram showing an example of configuration of a bias circuit as a voltage generating circuit.

FIG. 14 shows an example of configuration of the VBIAS as a voltage generating circuit.

As shown in FIG. 14, the VBIAS 197 includes resistances R0 to RN+1 and switches Sw0 to SwN. A switch Sw performs switching according to a signal from the CALC 198, and outputs a voltage corresponding to the code.

It suffices to be able to generate voltages corresponding to the voltages V0, V1, and V2 shown in FIGS. 13A and 13B among voltages generated by this resistance ladder.

A sequence for determining such a calibration voltage is performed.

Thereafter frequency calibration is performed. The calibration voltage Vcal is thereby corrected to be a voltage that maximizes band overlaps BOLH and BOLL at all times regardless of how elements forming the VCO 184 vary.

From the above, the voltage versus frequency conversion gain Kvco does not need to be increased more than is necessary, and thus the varactor capacitance does not need to be increased. That is, there is a possibility of a smaller area.

Further, because the voltage versus frequency conversion gain Kvco can be reduced, a tradeoff for phase noise design for the PLL can be relaxed, which also leads to the simplification of design.

As described above, the present embodiment can provide the following effects.

A band overlap can be maximized with a simple circuit configuration without depending on manufacturing variations.

Because the varactor capacitance does not need to be increased more than is necessary, a reduction in circuit area can be expected.

Because the varactor capacitance does not need to be increased more than is necessary, the voltage versus frequency conversion gain Kvco can be decreased, and a relaxation of phase noise design for the PLL can be expected.

The present disclosure contains subject matter related to that disclosed in Japanese Priority Patent Application JP 2010-181247 filed in the Japan Patent Office on Aug. 13, 2010, the entire content of which is hereby incorporated by reference.

It should be understood by those skilled in the art that various modifications, combinations, sub-combinations and alterations may occur depending on design requirements and other factors in so far as they are within the scope of the appended claims or the equivalents thereof.

What is claimed is:

1. A phase-locked circuit comprising:
a phase-locked section including a voltage controlled oscillator having a capacitance bank and changing oscillation frequency according to voltage information, the phase-locked section phase-locking an oscillating signal of said voltage controlled oscillator to a reference signal; and
a calibration section having a voltage correcting function for supplying an appropriate calibration voltage to said voltage controlled oscillator in performing frequency calibration for said voltage controlled oscillator;
said calibration section including
a counter circuit for counting frequency of the output oscillating signal of said voltage controlled oscillator, a first storage circuit and a second storage circuit for retaining a count result of said counter circuit, a comparator circuit for comparing the count result of said counter circuit with a target frequency, and determining whether the count result of said counter circuit is higher than the target frequency, a control circuit for receiving a result of said comparator circuit, comparing the count result of said counter circuit with a result retained by said first storage circuit, and controlling the capacitance bank of said voltage controlled oscillator, a voltage generating circuit for generating the calibration voltage, and supplying the calibration voltage to said voltage controlled oscillator, and a processing circuit for performing calculation from the count result of said counter circuit and results of said first storage circuit and said second storage circuit, and controlling said voltage generating circuit according to a result of the calculation.

2. The phase-locked circuit according to claim 1, wherein the processing circuit of said calibration section performs said calculation from three pieces of frequency data on a first frequency when said voltage generating circuit supplies a first voltage to said voltage controlled oscillator, a second frequency when said voltage generating circuit supplies a second voltage to said voltage controlled oscillator, and a third frequency when said voltage generating circuit supplies a third voltage to said voltage controlled oscillator, the first voltage, the second voltage, and the third voltage being three voltages different from each other.

3. The phase-locked circuit according to claim 2, wherein said processing circuit obtains an intermediate frequency from said first frequency and said second frequency, determines whether said second frequency is higher or lower than said intermediate frequency and makes case separation, obtains an approximate linear function of voltage versus frequency in each case, obtains an approximate voltage corresponding to the intermediate frequency, and controls said voltage generating circuit so as to generate a voltage according to the approximate voltage.

4. The phase-locked circuit according to claim 1, wherein said phase-locked section includes a phase comparator for comparing phases of said reference signal and the output oscillating signal of said voltage-controlled oscillator with each other, a charge pump for converting phase comparison information of said phase comparator into a current, and a loop filter for receiving the current flowing in from said charge pump, converting current information into voltage information, and supplying the voltage information to said voltage controlled oscillator.

5. A radio communicating device comprising:

an antenna receiving a radio signal;

a phase-locked circuit for outputting an oscillating signal phase-locked to a reference signal;

a low noise amplifier for controlling a gain of the received signal received by the antenna;

a first frequency converting section configured to subject the received signal received via said low noise amplifier to frequency conversion receiving the oscillating signal of said phase-locked circuit;

a second frequency converting section configured to subject a transmission signal to frequency conversion receiving the oscillating signal of said phase-locked circuit; and a power amplifier configured to amplify the transmission signal resulting from the frequency conversion of said second frequency converting section, and output the transmission signal to a side of said antenna;

said phase-locked circuit including a phase-locked section including a voltage controlled oscillator having a capacitance bank and changing oscillation frequency according to voltage information, the phase-locked section phase-locking the oscillating signal of said voltage controlled oscillator to the reference signal, and a calibration section having a voltage correcting function for supplying an appropriate calibration voltage to said voltage controlled oscillator in performing frequency calibration for the voltage controlled oscillator, said calibration section including a counter circuit for counting frequency of the output oscillating signal of said voltage controlled oscillator, a first storage circuit and a second storage circuit for retaining a count result of said counter circuit, a comparator circuit for comparing the count result of said counter circuit with a target frequency, and determining whether the count result of said counter circuit is higher than the target frequency, a control circuit for receiving a result of said comparator circuit, comparing the count result of said counter circuit with a result retained by said first storage circuit, and controlling the capacitance bank of said voltage controlled oscillator, a voltage generating circuit for generating the calibration voltage, and supplying the calibration voltage to said voltage controlled oscillator, and a processing circuit for performing calculation from the count result of said counter circuit and results of said first storage circuit and said second storage circuit, and controlling said voltage generating circuit according to a result of the calculation.

6. The radio communicating device according to claim 5, wherein the processing circuit of said calibration section performs said calculation from three pieces of frequency data on a first frequency when said voltage generating circuit supplies a first voltage to said voltage controlled oscillator, a second frequency when said voltage generating circuit supplies a second voltage to said voltage controlled oscillator, and a third frequency when said voltage generating circuit supplies a third voltage to said voltage controlled oscillator, the first voltage, the second voltage, and the third voltage being three voltages different from each other.

7. The radio communicating device according to claim 6, wherein said processing circuit obtains an intermediate frequency from said first frequency and said second frequency, determines whether said second frequency is higher or lower than said intermediate frequency and makes case separation, obtains an approximate linear function of voltage versus frequency in each case, obtains an approximate voltage corresponding to the intermediate frequency, and controls said voltage generating circuit so as to generate a voltage according to the approximate voltage.

8. The radio communicating device according to claim 5, wherein said phase-locked section includes a phase comparator for comparing phases of said reference signal and the output oscillating signal of said voltage-controlled oscillator with each other, a charge pump for converting phase comparison information of said phase comparator, into a current, and a loop filter for receiving the current flowing in from said charge pump, converting current information into voltage information, and supplying the voltage information to said voltage controlled oscillator.

* * * * *